US012363871B2

(12) United States Patent
Gao

(10) Patent No.: US 12,363,871 B2
(45) Date of Patent: Jul. 15, 2025

(54) ELECTRONICS CHASSIS WITH A BARRIER FORMING A LIQUID ISOLATION REGION

(71) Applicant: Lenovo Enterprise Solutions (Singapore) Pte Ltd., Singapore (SG)

(72) Inventor: Tianyi Gao, Greensboro, NC (US)

(73) Assignee: Lenovo Enterprise Solutions (Singapore) Pte Ltd., Singapore (SG)

( * ) Notice: Subject to any disclaimer, the term of this patent is extended or adjusted under 35 U.S.C. 154(b) by 290 days.

(21) Appl. No.: 18/194,079

(22) Filed: Mar. 31, 2023

(65) Prior Publication Data

US 2024/0334655 A1 Oct. 3, 2024

(51) Int. Cl.
*H05K 7/20* (2006.01)
*H05K 7/14* (2006.01)

(52) U.S. Cl.
CPC ....... *H05K 7/20781* (2013.01); *H05K 7/1489* (2013.01); *H05K 7/20272* (2013.01)

(58) Field of Classification Search
CPC ............ H05K 7/20781; H05K 7/1489; H05K 7/20272; H05K 7/20772; H05K 7/20645; H05K 7/20681
USPC ......................................................... 361/699
See application file for complete search history.

(56) References Cited

U.S. PATENT DOCUMENTS

| | | | | |
|---|---|---|---|---|
| 2003/0057546 A1* | 3/2003 | Memory | ............. | F28D 15/0266 257/706 |
| 2013/0043775 A1* | 2/2013 | Chen | .................. | H05K 7/20781 165/177 |
| 2013/0105116 A1* | 5/2013 | Campbell | .......... | H05K 7/20272 165/80.4 |
| 2017/0181327 A1* | 6/2017 | Shelnutt | ............. | H05K 7/20781 |
| 2023/0320029 A1* | 10/2023 | Kanai | ................ | H05K 7/20136 361/679.47 |

OTHER PUBLICATIONS

Gullbrand, Jessica (Intel) et.al., "Open Compute Project, ACS Liqid Cooling Cold Plate Requirements Document", Revision 1.0, Oct. 9, 2019, pp. 1-35.

* cited by examiner

*Primary Examiner* — Anatoly Vortman
*Assistant Examiner* — Kyle Oxenknecht
(74) *Attorney, Agent, or Firm* — Jeffrey L. Streets

(57) ABSTRACT

An electronics chassis houses a plurality of electronic devices and a liquid cooling module that includes a cooling block for cooling at least one electronic device. Each liquid cooling module has a module supply conduit permanently fixed to the cooling block and a module return conduit permanently fixed to the cooling block to form a liquid passageway. A liquid unit is also disposed in the chassis and includes a liquid supply conduit and a liquid return conduit that are connected to the module supply conduit and the module return conduit of the liquid cooling module. In addition, a liquid-tight barrier is disposed in the electronics chassis to divide the electronics chassis into an electronics region containing the plurality of electronic devices and the liquid cooling module, and a liquid isolation region containing the liquid unit and allow of the connections between the liquid unit and the liquid cooling module.

20 Claims, 5 Drawing Sheets

ELECTRONICS CHASSIS WITH A BARRIER FORMING A LIQUID ISOLATION REGION

BACKGROUND

The present disclosure relates to the use of liquid cooling modules to cool electronic devices in an electronics chassis.

BACKGROUND OF THE RELATED ART

Computing devices are trending toward smaller devices and form factors, allowing more computing devices to occupy a given amount of space. As a result, a greater amount of power may be consumed by the devices that occupy a given chassis, rack or datacenter. This greater power density results in the generation of an additional heat load that must be efficiently removed so that the computing devices are allowed to operate at a suitable temperature. Sets of fans have been used to force air through each chassis and across the computing devices to cool the devices, but there are limits to the efficiency of air cooling. For example, the operation of the fans consumes additional power and the chassis must be designed with suitable air passageways to cool each device. In order to meet a need to cool high performance computing devices with a high power density, liquid cooling modules are becoming more prevalent.

BRIEF SUMMARY

Some embodiments provide an apparatus comprising an electronics chassis having a plurality of panels forming an enclosure, a plurality of electronic devices disposed within the electronics chassis, and a liquid cooling module. The liquid cooling module includes a cooling block in thermal contact with at least one of the electronic devices, a module supply conduit permanently fixed to the cooling block, and a module return conduit permanently fixed to the cooling block, wherein the liquid cooling module forms a liquid passageway from the module supply conduit through the cooling block to the module return conduit. The apparatus further comprises a liquid unit including a liquid supply conduit and a liquid return conduit, wherein the liquid supply conduit includes an upstream supply connector for connecting to an external liquid supply conduit and a downstream supply connector for connecting to the module supply conduit, and wherein the liquid return conduit has an upstream return connector for connecting to the module return conduit and a downstream return connector for connecting to an external liquid return conduit. In addition, the apparatus comprises a liquid-tight barrier disposed in the electronics chassis and dividing the electronics chassis into an electronics region and a liquid isolation region. The plurality of electronic devices and the liquid cooling module are located in the electronics region, whereas the liquid unit is located in the liquid isolation region. Furthermore, the module supply conduit extends across the liquid-tight barrier from the electronics region to the liquid isolation region where the module supply conduit is connected to the downstream supply connector, and the module return conduit extends across the liquid-tight barrier from the electronics region to the liquid isolation region where the module return conduit is connected to the upstream return connector.

DETAILED DESCRIPTION

Figure 1:
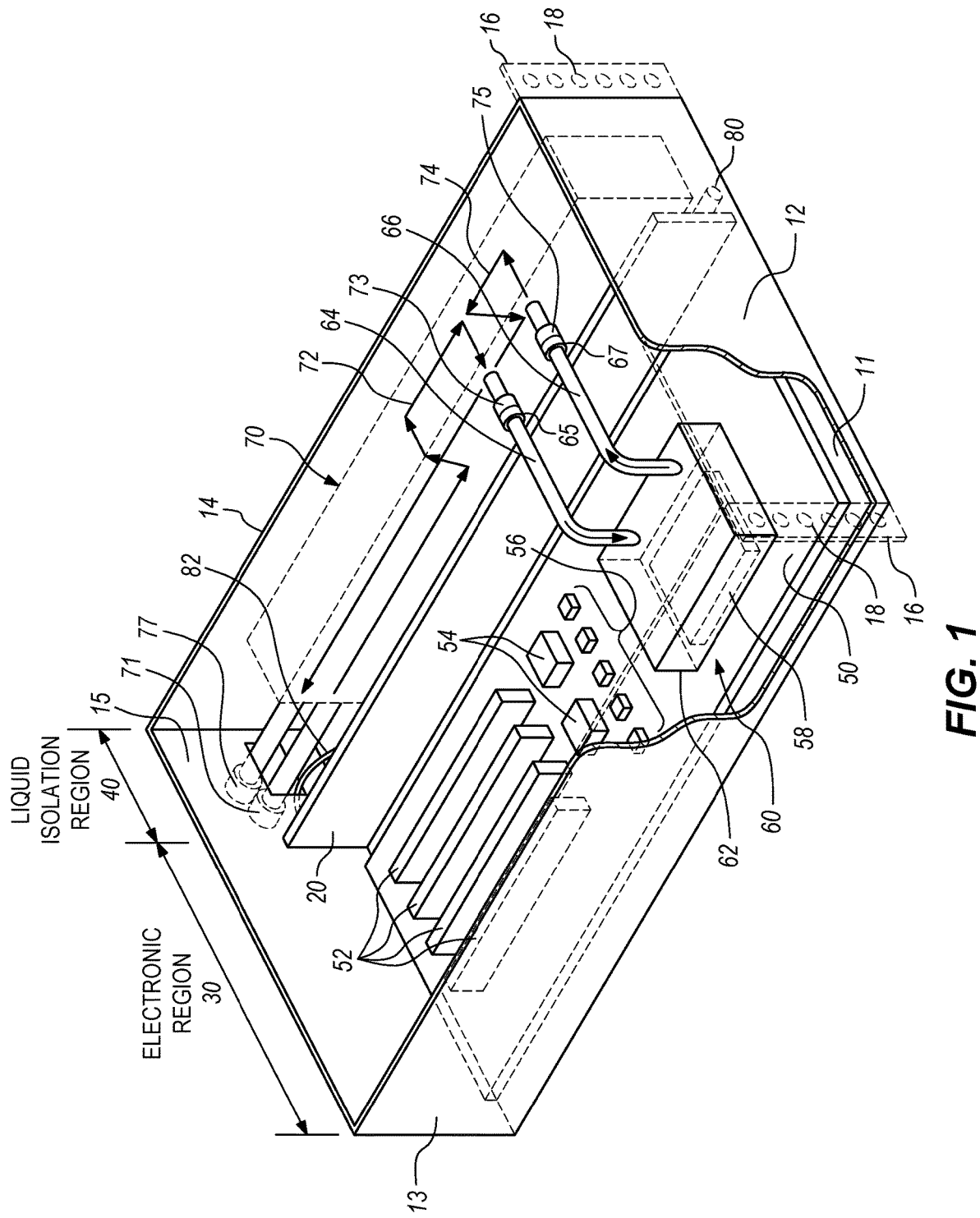
FIG. 1 is a perspective view of an electronics chassis having a barrier that divides the space within the chassis into an electronics region and a liquid isolation region.

Some embodiments provide an apparatus comprising an electronics chassis having a plurality of panels forming an enclosure, a plurality of electronic devices disposed within the electronics chassis, and a liquid cooling module. The liquid cooling module includes a cooling block in thermal contact with at least one of the electronic devices, a module supply conduit permanently fixed to the cooling block, and a module return conduit permanently fixed to the cooling block, wherein the liquid cooling module forms a liquid passageway from the module supply conduit through the cooling block to the module return conduit. The apparatus further comprises a liquid unit including a liquid supply conduit and a liquid return conduit, wherein the liquid supply conduit includes an upstream supply connector for connecting to an external liquid supply conduit and a downstream supply connector for connecting to the module supply conduit, and wherein the liquid return conduit has an upstream return connector for connecting to the module return conduit and a downstream return connector for connecting to an external liquid return conduit. In addition, the apparatus comprises a liquid-tight barrier disposed in the electronics chassis and dividing the electronics chassis into an electronics region and a liquid isolation region. The plurality of electronic devices and the liquid cooling module are located in the electronics region, whereas the liquid unit is located in the liquid isolation region. Furthermore, the module supply conduit extends across the liquid-tight barrier from the electronics region to the liquid isolation region where the module supply conduit is connected to the downstream supply connector, and the module return conduit extends across the liquid-tight barrier from the electronics region to the liquid isolation region where the module return conduit is connected to the upstream return connector.

An electronics chassis may be made from any suitable material but is typically formed by bending sheet metal into various panels and/or by attaching sheet metal panels together. The electronics chassis may be a rectangular cuboid, but embodiments herein are not limited to such shape. In general, an electronics chassis is any chassis that is used to house electronic components, such as the electronic components comprising a compute node, compute server or other information technology equipment. Often an electronics chassis is further adapted to be secured in a rack, which may be of standard dimensions for securing the electronics chassis measuring some number of rack units. An electronics chassis may also be equipped with a flange having mounting holes therethrough at a spacing that matches the spacing of threaded holes in the rack. Accordingly, an electronics chassis used in an information technology system may be secured at any of a variety of positions within the rack using fasteners, such as threaded screws. The electronics chassis may have other features and functions, such as vents and fans, that are not instrumental to the embodiments disclosed herein.

A liquid cooling module is a structure that promotes heat exchange from an electronic component into a liquid, such as water or various coolant compositions and mixtures. For example, one suitable liquid is a mixture of water and ethylene glycol and/or other additives. The liquid cooling module is preferably secured in physical contact with the electronic component so that heat may be conducted from the electronic component into a cooling block. A liquid, such as water, is forced through one or more passages within the cooling to absorb heat from the cooling block and carry that heat with the liquid as it is subsequently removed from the cooling block. The liquid may be cooled prior to use or may be an ambient temperature, but the temperature of the liquid is expected to rise as it takes on heat energy from the electronic component. However, cooling block passages are sealed to maintain containment of the liquid and prevent the electronic component from ever coming into direct contact with the liquid. A cooling block is preferably made from a material with a high thermal conductivity, such as various metals. The most preferred material for the cooling block is copper or a copper alloy. Furthermore, in order for the liquid cooling module to avoid having any interfaces with the potential for leaking liquid, the module supply conduit and module return conduit may both be made from the same or compatible material as the cooling block so that the conduits may be welded or otherwise bonded so as to be permanently fixed to the cooling block. The module supply conduit and the module return conduit may be independently selected from hard conduits and flexible conduits, such as hard metal conduits and flexible metal conduits. The term "permanently fixed" is used to describe connections that not intended to be detached in the normal operation or use of the device. A welded connection is one example of a manner in which a conduit may be permanently fixed to the cooling block even though such conduit could be cut off. Such welded connection is still "permanent" because a welded connection between the cooling block and a conduit is not made to be detached in the normal operation or use of the device.

A liquid unit includes a liquid supply conduit and a liquid return conduit. The liquid supply conduit and the liquid return conduit both extend from a back panel of the electronics chassis to a location adjacent the liquid cooling module. The liquid supply conduit includes an upstream supply connector (near the back panel) for connecting to an external liquid supply conduit and a downstream supply connector (adjacent the liquid cooling module) for connecting to the module supply conduit. Similarly, the liquid return conduit has an upstream return connector (adjacent the liquid cooling module) for connecting to the module return conduit and a downstream return connector (near the back panel) for connecting to an external liquid return conduit. The external liquid supply conduit and the external liquid return conduit may each be rack-level manifolds that provide connectors at various elevations in the rack to support liquid cooling in multiple server chassis according to embodiments described herein. The term "manifold," as used herein, means a conduit that has a different number of outlets than the number of inlets. A liquid supply manifold will typically have more outlet ports or connections than inlet ports or connections. A liquid return manifold will typically have more inlet ports or connections than outlet ports or connections.

In some embodiments, the liquid supply conduit and the liquid return conduit may also be manifolds so as to support liquid cooling of various electronic components with multiple liquid cooling modules within a single server chassis. Specifically, a liquid supply conduit that is a manifold may have a single connection to the external liquid supply conduit and multiple branches for connection to multiple module supply conduits. Similarly, a liquid return conduit that is a manifold may have multiple branches for connection to the multiple module return conduits and a single connection to the external liquid return conduit. Any number of liquid cooling modules may be implemented within a single server chassis.

The liquid-tight barrier is disposed in the electronics chassis to divide the electronics chassis into an electronics region and a liquid isolation region. The barrier may be made with any liquid impermeable material that can be secured in the electronics chassis, such as a plastic or metal. Furthermore, the barrier may be secured in a desired position with fasteners or weld. One preferred barrier extends from a front panel of the electronics chassis to a back panel of the electronics chassis to divide the electronics chassis into two regions, such as rectangular regions. The barrier may be a linear panel, but the barrier may have other shapes or paths. The barrier may contact a floor or base panel of the electronics chassis and extend upward to stop any flow of liquid from the liquid isolation region to the electronics region. Optionally, the barrier may be sealed to the base panel and/or the back and front panels by welding or use of a separate seal or sealing material along the edges of the barrier. A seal may further prevent liquid from seeping under the barrier or around the barrier. It is not necessary or practical for the barrier to engage and/or seal with a top panel of the electronics chassis. Rather, the barrier should prevent any liquid leaking into the liquid isolation region from flowing into the electronics region along the base panel or along the front and back end panels.

In some embodiments, all of the liquid supply or return connectors are located in the liquid isolation region, leaving no liquid supply or return connectors located in the electronics region. Accordingly, any liquid released from a leaking connection will drop into the liquid isolation region and remain in the liquid isolation region. Furthermore, quick connect fittings may release a small amount of water during any disconnect operation and such liquid will similarly drop into the liquid isolation region and remain in the liquid isolation region. Still further, one or more of the conduits in the fluid unit, which is located in the liquid isolation region, may be flexible conduits or tubes that could become accidentally damaged during some other maintenance operation. Any liquid escaping from a damaged conduit in the fluid unit will not reach the electronics region due the presence of the barrier and any optional seals or sealing material. In one option, the module supply conduit and/or the module return conduit may have a slight downward angle toward their distal end (i.e., toward the liquid isolation region) such that any leaking liquid adhering to the outer surface of the conduit in the liquid isolation region will not flow along the conduit toward or into the electronics region.

In some embodiments, a liquid detection device may be located in the bottom of the liquid isolation region. The liquid detection device is preferably located in the bottom of the liquid isolation region adjacent the liquid-tight barrier. The liquid detection device may be a liquid leak detection cable. One type of leak detection cable includes a plurality of sensors spaced apart along the length of the cable, such that any water that bridges the gap between any two adjacent sensors will activate a signal. The signal from the liquid leak detection device may be transmitted to a controller, such as a baseboard management controller on a server within the same server chassis, a system management server, or a controller dedicated to leak detection or liquid cooling systems management. Optionally, the leak detection device is coupled to a signal wire that extend out the back end of the electronics chassis for connection to the controller. When the leak detection device transmits a signal on the signal wire indicating that there is liquid present in the liquid isolation region, the controller may take any one or more action, such as triggering an alert indicator or message.

Some embodiments of the apparatus may further comprise the external liquid supply conduit and the external liquid return conduit. The external liquid supply conduit may be a manifold having connectors disposed at a plurality of locations within a rack and the external liquid return conduit may be a manifold having connectors disposed at the plurality of locations within the rack. The plurality of locations within the rack may include various elevations within the rack to facilitate connections with a plurality of server chassis according to some embodiments. In one option, the upstream supply connector of the liquid supply conduit may be positioned for blind mating with the external supply conduit when the electronics chassis is inserted into the rack. Similarly, the downstream return connector of the liquid return conduit may be positioned for blind mating with the external return conduit when the electronics chassis is inserted into the rack.

In some embodiments, one or more of the connectors on the various conduits may be quick-connect couplings and/or threaded couplings.

In some embodiments, the liquid supply conduit may include flexible conduit to facilitate manual alignment and connection of the downstream liquid supply connector to the module supply connector within the liquid isolation region. Similarly, the liquid return conduit may include flexible conduit to facilitate manual alignment and connection of the upstream liquid return connector to the module return connector within the liquid isolation region.

In some embodiments, the plurality of electronic devices may include a compute node or server having a central processing unit, and wherein the liquid cooling module is in thermal contact with the central processing unit. Without limitation, the liquid cooling module may be in thermal contact with any of the electronic devices within the electronics chassis, but are preferably in thermal contact with electronic devices that generate substantial amounts of heat and/or would reach undesirably high temperatures without liquid cooling. For example, the liquid cooling module may in thermal contact with one or more central processing units, one or more graphics processing units, and/or other specialized processing units.

In some embodiments, the liquid-tight barrier may also support the module supply conduit and/or the module return conduit as they extend across the barrier. For example, the barrier may have an upper edge, an opening or a recess that is positioned to contact the underneath side of one or both of the conduits and to support the conduits so the conduit is unable to drop or sag and thereby impart torque on the liquid cooling module and/or the electronic components that are in thermal contact with the liquid cooling module. The conduits themselves have some weight due to their material of construction and, during used, the conduits are filled with liquid that has additional weight applying a downward force on the conduits. The support is particularly important because the module supply and return conduits are both extending in the same direction and extend beyond the perimeter of the liquid cooling module and across the barrier. Accordingly, the forces on the liquid cooling module may be balanced by providing support for the conduits where they extend across the barrier. The configuration and/or height of the barrier may be modified to support the liquid supply and return conduits of any one or more liquid cooling module in the electronics region of the electronics chassis.

Some embodiments may further include a support member within the liquid isolation region for supporting the upstream supply connector and the downstream supply connector. These connectors and the conduit connected to them have weight and will, during use, be filled with liquid weighing them down further. Accordingly, a support member may be used to support the liquid supply and return conduits and the corresponding connectors, preferably at the same elevation as the module supply and return conduits and their corresponding connectors. The support member may be in the form of a barrier, such as a liquid tight barrier, but may also be any configuration of a support, such as a support bar or bracket extending upward from the base panel of the electronics chassis or extending from the front panel to the back panel.

In some embodiments, the apparatus may include a second liquid cooling module or any number of additional liquid cooling modules. For example, a second liquid cooling module may include a second cooling block in thermal contact with at least a second one of the electronic devices in the electronics chassis. Furthermore, the second liquid cooling module may include a second module supply conduit permanently fixed to the second cooling block and a second module return conduit permanently fixed to the second cooling block. In this configuration, the second liquid cooling module forms a second liquid passageway from the second module supply conduit through the second cooling block to the second module return conduit. The liquid supply conduit may have a second downstream supply connector for connecting to the second module supply conduit and the liquid return conduit may have a second upstream return connector for connecting to the second module return conduit. It should be recognized that the second liquid cooling module may have any one or more characteristic disclosed as a possible characteristic of the first liquid cooling module, but the first and second liquid cooling module are not required to be the same. Each liquid cooling module may be independently designed.

In some embodiments, the module supply or return conduit may be branched to support the use of two or more liquid cooling modules from a single downstream supply connector or a single upstream return connector, respectively. This means that two liquid cooling modules may be in parallel fluid loops, although two liquid cooling modules may alternatively be in series. In one example, a second liquid cooling module may include a second cooling block in thermal contact with at least a second one of the electronic devices, a second module supply conduit permanently fixed to the second cooling block, and a second module return conduit permanently fixed to the second cooling block. The second liquid cooling module thereby forms a second liquid passageway from the second module supply conduit through the second cooling block to the second module return conduit. However, the second module supply conduit may be permanently branched off of the (first) module supply conduit and the second module return conduit may be permanently branched off of the (first) module return conduit. In other words, a module supply conduit may contain a "Y" or branch that allows the liquid to be supplied to two liquid cooling modules from a single liquid supply conduit and a module return conduit may container a "Y" or branch that allows liquid to be returned from the two liquid cooling modules to a single liquid return conduit.

In some embodiments, a second plurality of electronic devices may be disposed within the electronics region of the electronics chassis, wherein the second plurality of electronic devices are secured to a printed circuit board directly above the first plurality of electronic devices. A second liquid cooling module may include a second cooling block in thermal contact with at least one of the electronic devices in the second plurality of electronic devices, a second module supply conduit may be permanently fixed to the second cooling block, and a second module return conduit may be permanently fixed to the second cooling block. In this manner, the second liquid cooling module forms a second liquid passageway from the second module supply conduit through the second cooling block to the second module return conduit. The liquid supply conduit has a second downstream supply connector for connecting to the second module supply conduit and the liquid return conduit has a second upstream return connector for connecting to the second module return conduit. The barrier preferably extends upward to support the module supply conduit and the module return conduit of the (first) liquid cooling module, and extends further upward to support the second module supply conduit and the second module return conduit of the second liquid cooling module.

Some embodiments of the apparatus may include a second liquid unit, which may be similar to the (first) liquid unit. For example, the second liquid unit may include a second liquid supply conduit and a second liquid return conduit. Furthermore, the second liquid supply conduit may include a second upstream supply connector for connecting to a second external liquid supply conduit and a second downstream supply connector for connecting to the second module supply conduit. Similarly, the second liquid return conduit may include a second upstream return connector for connecting to the second module return conduit and a second downstream return connector for connecting to a second external liquid return conduit. The second liquid unit is preferable located in the same liquid isolation region as the (first) liquid unit.

In some embodiments, the apparatus may further include a second liquid-tight barrier disposed in the electronics chassis and further dividing the electronics chassis to create a second electronics region and leaving the liquid isolation region between the two electronics regions. Optionally, a second plurality of electronic devices and a second liquid cooling module may be located in the second electronics region. The second liquid cooling module may include a second cooling block in thermal contact with at least one of the electronic devices in the second electronics region, a second module supply conduit permanently fixed to the second cooling block, and a second module return conduit permanently fixed to the second cooling block, such that the second liquid cooling module forms a second liquid passageway from the second module supply conduit through the second cooling block to the second module return conduit. The second liquid unit is located in the liquid isolation region, the second module supply conduit extends across the second liquid-tight barrier from the second electronics region to the liquid isolation region where the second module supply conduit is connected to the second downstream supply connector, and the second module return conduit extends across the second liquid-tight barrier from the second electronics region to the liquid isolation region where the second module return conduit is connected to the second upstream return connector.

In some embodiments of the apparatus that include a second liquid unit, the liquid cooling module may include a second module supply conduit permanently fixed to the cooling block and a second module return conduit permanently fixed to the cooling block. Accordingly, the liquid cooling module forms a second liquid passageway from the second module supply conduit through the cooling block to the second module return conduit. Note that the same liquid cooling module still has the (first) liquid passageway from the (first) module supply conduit through the cooling block to the (first) module return conduit, such that there are two independent passageways for passing liquid through the cooling block. The second module supply conduit extends across the liquid-tight barrier from the electronics region to the liquid isolation region where the second module supply conduit is connected to the second downstream supply connector of the second liquid unit, and the second module return conduit extends across the liquid-tight barrier from the electronics region to the liquid isolation region where the second module return conduit is connected to the second upstream return connector of the second liquid unit. Because the (first) module supply and return conduits are connected to the (first) liquid unit and the second module supply and return conduits are connected to the second liquid unit, it can be said that the cooling block has fully redundant liquid loops. In other words, if one of the liquid loops is shut off or requires maintenance, the other liquid loop may continue to supply liquid to the cooling block. This redundant cooling may be beneficial for some critical high-performance processors or other electronic components.

Some embodiments provide the technical benefit of enabling the use of liquid cooling modules to cool electronic components without risk of the electronic components being damaged by a liquid leak. This technical benefit is achieved using a liquid tight barrier to divide the electronics chassis in an electronics region containing all of the electronic components and a liquid isolation region containing all of the liquid connections. Any liquid leaks that may occur in the liquid isolation region are prevented from flowing into the electronics region and leak detection in the liquid isolation region may promptly notify an administrator of the problem. Furthermore, a leaking connector or conduit is easier to service or replace given that the connector or conduit is not located directly over the top of the electronic components.

FIG. 1 is a perspective view of an electronics chassis 10 having a barrier 20 that divides the space within the chassis 10 into an electronics region 30 and a liquid isolation region 40. The illustrated electronics chassis 10 includes a plurality of panels forming an enclosure. The panels include a base panel 11, a front end panel 12, a left side panel 13, a right side panel 14, and a back end panel 15. The electronics chassis 10 will preferably further include a top panel extending across the top between the end panels 12, 15 and the side panels 13, 14, but is not shown in order to facilitate illustration of the embodiments. Furthermore, the front end panel 12 and left side panel 13 are shown with a cutout portion for the purpose of illustrating the embodiments, but would typically be complete panels as shown by the dashed lines. The electronics chassis 10 is also shown having flanges 16 extending from the front end panel 12 and including mounting holes 18 to facilitate coupling the chassis into a rack (not shown; see FIG. 5). The panels may include additional features not shown, such as ventilation, electronic connections, control buttons, or a light panel. However, these additional features are not central to a description of the present embodiments.

A plurality of electronic devices 52, 54, 56, 58 are disposed within the electronics chassis 10, shown as being secured to a printed circuit board 50. In one non-limiting example, the plurality of electronic devices may comprise a compute node wherein the device 58 is a central processing unit, and wherein the liquid cooling module 60 is in thermal contact with the central processing unit 58. Of all the electronic devices in the compute node, the central processing unit may produce the most heat and be in most need of cooling with a liquid cooling module.

The electronic chassis 10 further includes a liquid cooling module 60. The liquid cooling module 60 includes a cooling block 62 in thermal contact with the electronic device 58 (shown in dashed lines), a module supply conduit 64 permanently fixed to the cooling block 62, and a module return conduit 66 permanently fixed to the cooling block 62. Accordingly, the liquid cooling module 60 forms a liquid passageway from the module supply conduit 64 through the cooling block 62 to the module return conduit 66. Directional arrows are provided on the conduits 64, 66 to indicate a direction of liquid flow to and from the cooling block 62, but the embodiment would also function with the direction of liquid flow reversed.

The electronics chassis 10 further comprises a liquid unit 70 (see dashed outline) including a liquid supply conduit 72 (illustrated by a first series of arrows) and a liquid return conduit 74 (illustrated by a second series of arrows). The path of the conduits 72, 74 within the liquid unit 70 may be modified as desired but will generally remain within the boundaries indicated by the dashed lines. The liquid supply conduit 72 includes an upstream supply connector 71 for connecting to an external liquid supply conduit (not shown; see FIG. 5) and a downstream supply connector 73 for connecting to the module supply conduit 64. The liquid return conduit 74 includes an upstream return connector 75 for connecting to the module return conduit 66 and a downstream return connector 77 for connecting to an external liquid return conduit (not shown; see FIG. 5). As shown, the liquid unit 70 provides liquid to and from the cooling module 60.

The liquid-tight barrier 20 is disposed in the electronics chassis 10 to divide the electronics chassis 10 into the electronics region 30 and the liquid isolation region 40. While the electronics region 30 is illustrated on the left side of the electronics chassis 10 and the liquid isolation region 40 is illustrated on the right side of the electronics chassis 10, the embodiments are not limited to this configuration. However, in the illustrated embodiment, the barrier 20 is a rectangular panel or plate that extends upward from the base plate 11 and extends from the front end panel 12 to the back end panel 15. The liquid-tight barrier 20 will not allow liquid to pass therethrough and is preferably scaled to the base plate 11, the front end panel 12 and the back end panel 15 to prevent liquid from seeping under or around the edges of the barrier 20.

The plurality of electronic devices 52, 54, 56, 58 and the liquid cooling module 60 are located in the electronics region 30, whereas the liquid unit 70 is located in the liquid isolation region 40. Furthermore, the module supply conduit 64 extends across the liquid-tight barrier 20 from the electronics region 30 to the liquid isolation region 40 where the module supply conduit 64 is connected to the downstream supply connector 73. The module return conduit 66 extends across the liquid-tight barrier 20 from the electronics region 30 to the liquid isolation region 40 where the module return conduit 66 is connected to the upstream return connector 75.

As shown, there are no liquid supply or return connectors located in the electronics region 30. Any liquid leaking or otherwise released from a connector or coupling will be contained in the liquid isolation region 40. To eliminate potential leaks within the electronics region 30, the module supply conduit 64 and the module return conduit 66 are each permanently fixed to the cooling block 62, such as by a weld or bond. For example, the cooling block 62, the module supply conduit 64, and the module return conduit 66 may each be made of a metal, with the conduits welded to the cooling block. Furthermore, the module supply conduit and the module return conduit may be hard metal conduits and/or flexible metal conduits.

A leak detection unit 80 may be disposed in the liquid isolation region 40, preferably along the base panel 11 and most preferably along the base panel 11 adjacent the barrier 20. The leak detection unit 80 may extend a substantial portion of the distance from the front panel 12 to the back panel 15 (see also FIG. 5) and may include a signal cable 82 that transmits a signal to a controller (not shown) in response to detecting liquid.

The module supply conduit 64 has a distal end with a module supply conduit connector 65 for manually connecting with the downstream supply connector 73 and the module return conduit 66 has a distal end with a module return conduit connector 67 for manually connecting with the upstream return connector 75. For example, the module supply conduit connector 65 and the downstream supply connector 73 may form a quick-connect coupling or a threaded coupling, and the module return conduit connector 67 and the upstream return connector 75 may form a quick-connect coupling or a threaded coupling. In a further option, the liquid supply conduit 72 and/or the liquid return conduit 74 may be flexible conduits, such as tubes or hoses, to be flexibly manipulated and positioned to align and engaged with the module supply conduit 64 and the module return conduit 66, respectively.

Figure 2:
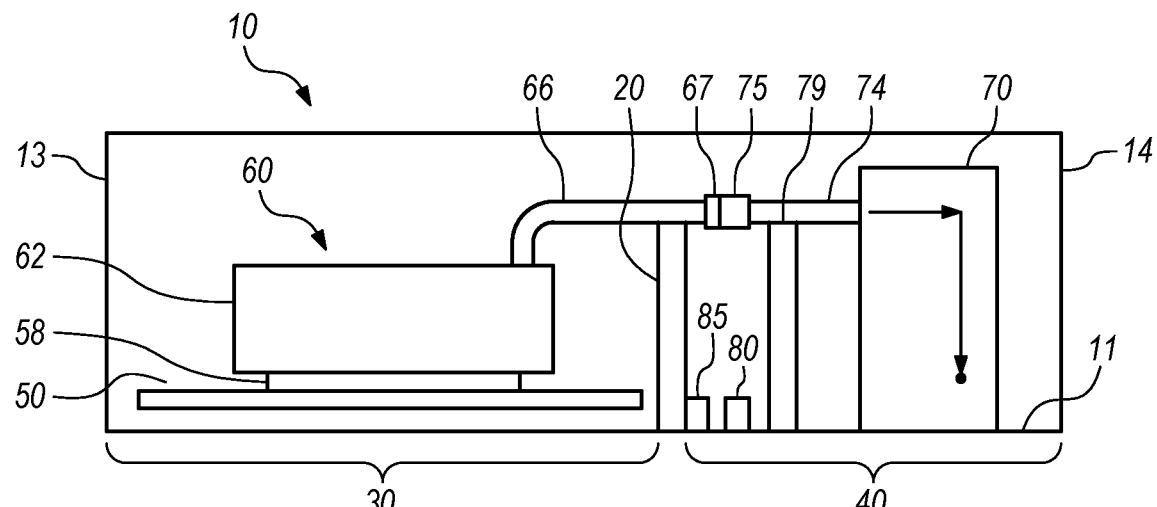
FIG. 2 is a front end view of the electronics chassis of FIG. 1 including an optional conduit support member.

FIG. 2 is a schematic diagram of the electronics chassis 10 of FIG. 1 from the front end, but without the front end blocking the view. Accordingly, the cooling block 58 is shown in thermal contact with a top surface of the electronic device 58 that is mounted on the printed circuit board and the module return conduit 66 is shown extending up and over the barrier 20 to position its module return conduit connector 67 in the liquid isolation region 40. Note that the barrier 20 extend upward from the base panel 11 to an elevation that supports the module return conduit 66. Furthermore, the module return conduit 66 has been aligned with the liquid return conduit 74 of the liquid unit 70 to enable the module return conduit connector 67 to be coupled with the upstream return connector 75. To facilitate the alignment and further support the weight of the liquid-filled conduits, the electronics chassis 10 includes an optional conduit support member 79. The support member 79 is located within the liquid isolation region 40 and may support both the upstream return connector 75 and the downstream supply connector 73 (not shown; see FIG. 1). Of further note, the liquid detection device 80 is located in on the bottom panel 11 adjacent the barrier 20 and an optional sealing member 85. Both the barrier 20 and the support member 79 may or may not be customized for a given configuration of one or more cooling modules 60.

Figure 3:
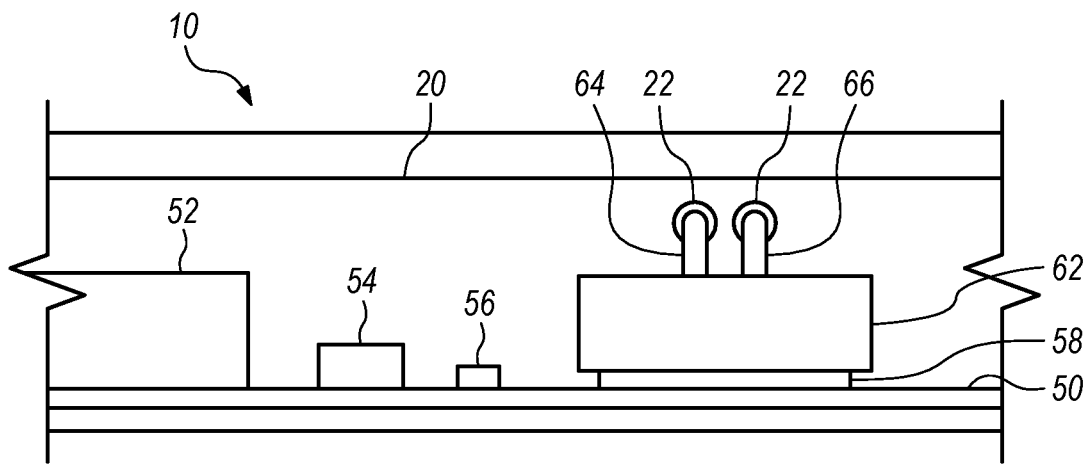
FIG. 3 is a left side view of the electronics chassis of FIG. 1 having a taller barrier having passageways for the supply and return conduits that are part of the liquid cooling module.

FIG. 3 is a left side view of the electronics chassis 10 of FIG. 1 having a taller barrier 20 having passageways or openings 22 therethrough for receiving the supply and return conduits 64, 66 that are connected to the cooling block 62. The openings 22 provide a path for the conduits 64, 66 to extend across the barrier 20 form the electronics region to the liquid unit. The bottom of the openings 22 support the conduits against sagging and applying a torque on the cooling block 62 and/or the electronic device 58.

Figure 4:
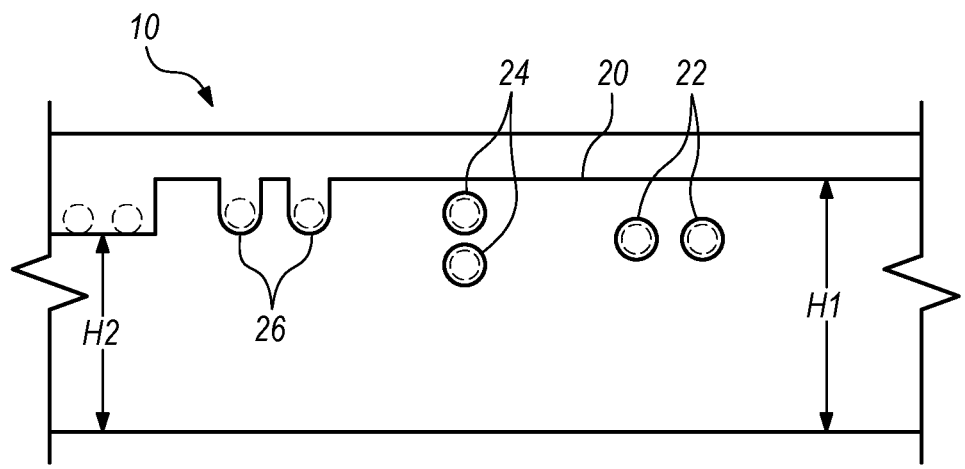
FIG. 4 is a schematic diagram of a barrier illustrating various configurations for enabling conduits to extend across the barrier from the electronics region to the liquid isolation region.

FIG. 4 is a schematic diagram of a barrier 20 illustrating various configurations for enabling conduits (illustrated in dashed lines) to extend across the barrier 20 from the electronics region to the liquid isolation region. The two openings 22 are shown as provided in FIG. 3. Two more openings 24 are shown one above the other, rather than side by side. Two U-shaped channels 26 are shown as another option for supporting the conduits. Furthermore, the barrier 20 may have a first height H1 in some locations along the length of the barrier, and the barrier 20 may have a second height H2 in other locations along the length of the barrier.

Figure 5:
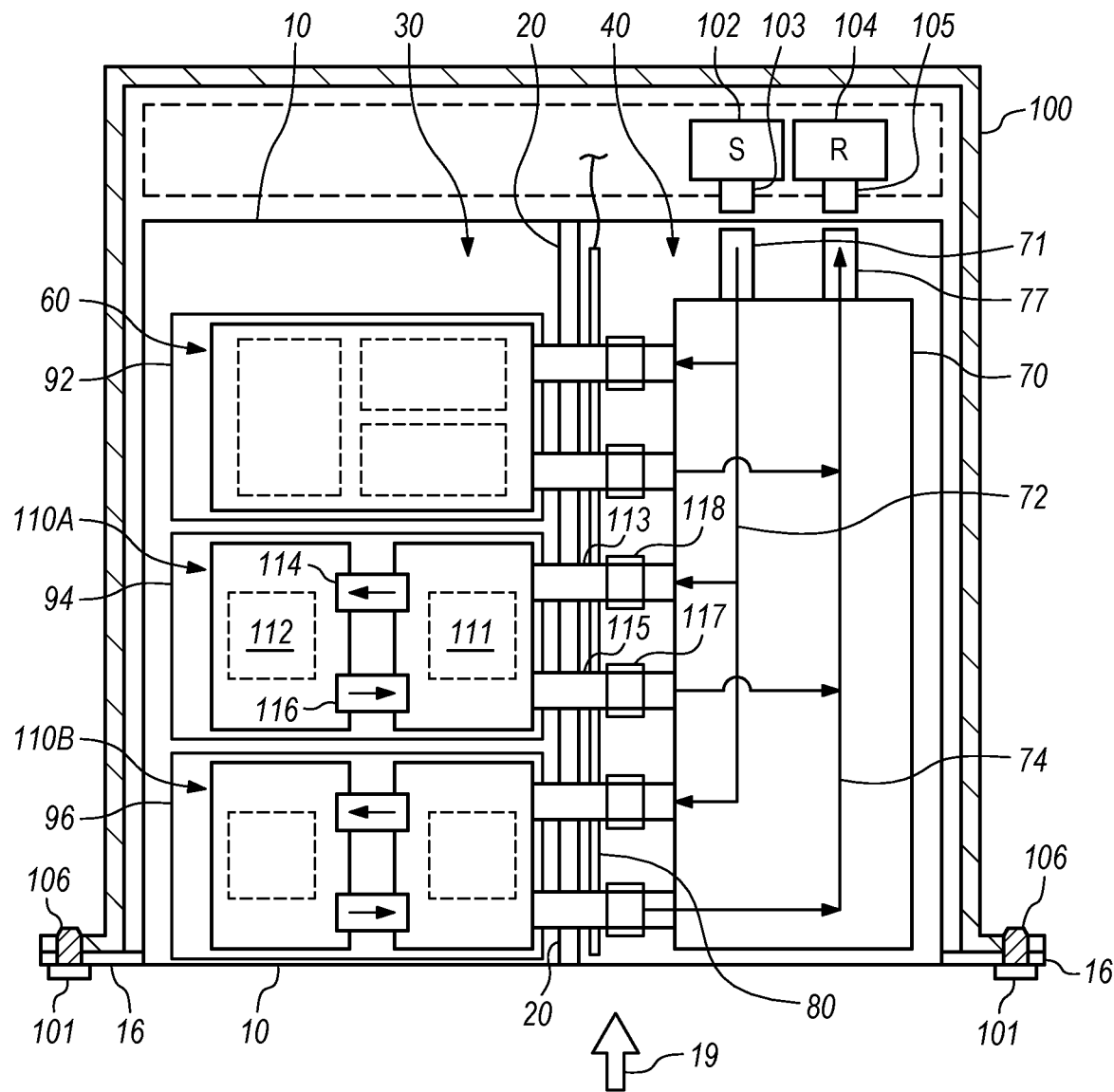
FIG. 5 is a top view of an electronics chassis having three separate electronics modules in the electronics region and a fluid unit in the liquid isolation region that is configured for blind mating into a rack.

FIG. 5 is a top view of the electronics chassis 10 having three separate electronics modules 92, 94, 96 in the electronics region 30 (on the left of the barrier 20) and a fluid unit 70 in the liquid isolation region 40 that is configured for blind mating into a rack 100. The rack 100 includes an external supply conduit 102 ("S) and an external return conduit 104 ("R"). Both of the external conduits 102, 104 are inside the rack 100, but are "external" to the electronics chassis 10. The external conduits 102, 104 extend vertically in the rack 10 (i.e., in and out of the plane of the illustration of FIG. 5), but have respective blind mate connectors, forming the external supply connector 103 and the external return connector 105.

As the electronics chassis 10 in inserted into the rack 100 (in the direction of the arrow 19), the upstream supply connector 71 aligns with the external supply connector 103 for blind mating to form a connection and the downstream return connector 77 aligns with the external return connector 105 for blind mating to form a connection. Once inserted to the position shown, the electronics chassis 10 may be held in position by extending threaded screws 101 through the mounting holes 18 of the flanges 16 and threading them into threaded holes 106 in the rack. The external liquid supply conduit 102 may be a manifold having connectors disposed at a plurality of elevations within the rack and the external liquid return conduit 104 may be a manifold having connectors disposed at the plurality of elevations within the rack.

In addition to the (first) liquid cooling module 60 that has been shown in FIGS. 1-4, a second liquid cooling module 110A and a third liquid cooling module 110B are shown. In this example, the second and third liquid cooling modules are both formed with two cooling blocks such that only the second liquid cooling module 110A will be described in detail. However, note that the second and third cooling modules have their own connections to the fluid unit 70.

The second liquid cooling module 110A includes a first cooling block 111 and a second cooling block 112 in thermal contact with respective electronic devices (illustrated in dashed lines). A first module supply conduit 113 is permanently fixed to the first cooling block 111 and a second module supply conduit 114 is permanently fixed to both the first cooling block 111 and the second cooling block 112. Similarly, a first module return conduit 115 is permanently fixed to the first cooling block 111 and a second module return conduit 116 is permanently fixed between the first cooling block 111 and the second cooling block 112. A liquid passageway is formed from the first module supply conduit 113 to the first cooling block 111, then from the first cooling block 111 through module supply conduit 114 to the second cooling block 112. After the liquid passes through the second cooling block 112, the liquid passes through the second module return conduit 116 to the first cooling block 111, and then from the first cooling block 111 to the module return conduit 115. The liquid return conduit 74 has a second upstream return connector 117 for connecting to the second module return conduit 115 and the liquid supply conduit 72 has a second downstream supply connector 118 for connecting to the second module supply conduit 113. Embodiments may encompass other liquid pathways and configurations.

Figure 6A:
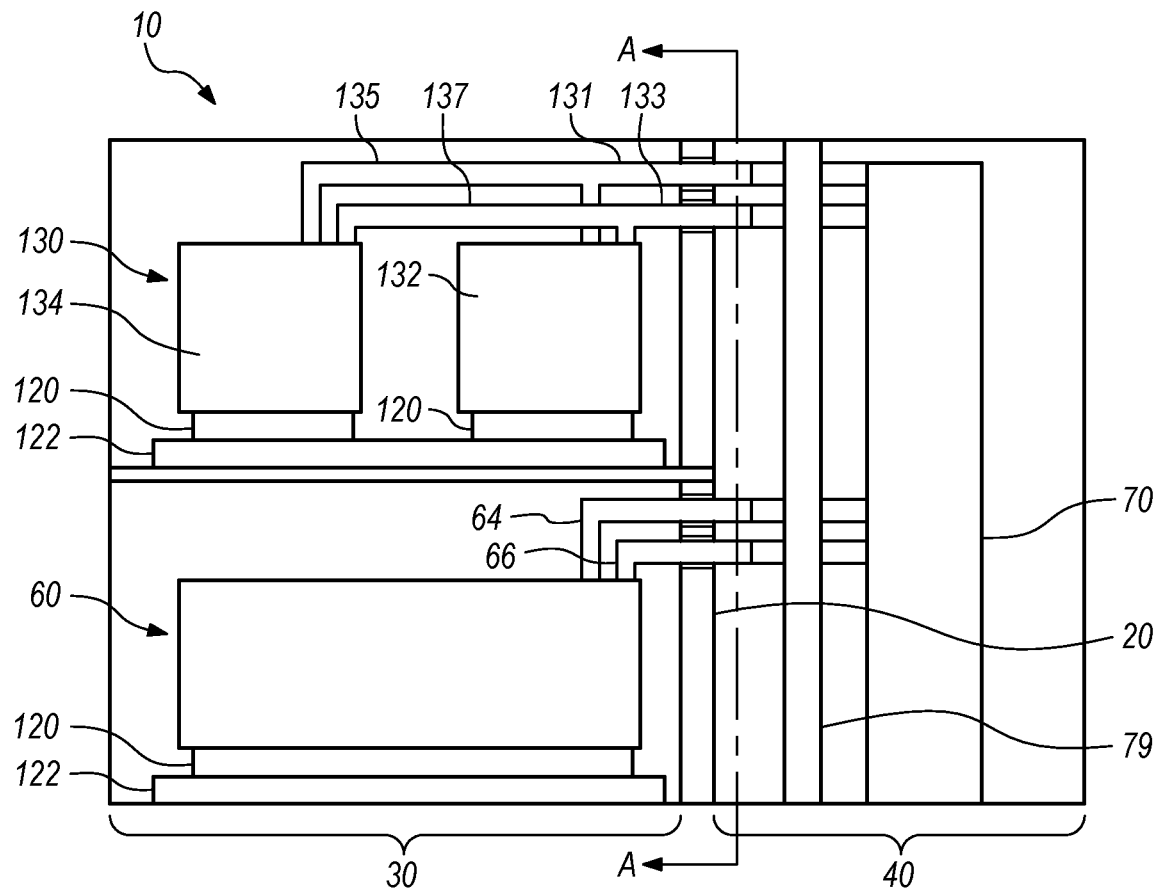
FIG. 6A is a front end view of an electronics chassis having electronic components on two separate printed circuit boards configured one above the other with liquid cooling modules in communication with the same fluid unit.

FIG. 6A is a front end view of an electronics chassis 10 having electronic components 120 on two separate printed circuit boards 122 configured one above the other with liquid cooling modules 60, 130 in communication with a single fluid unit 70. The liquid cooling module 60 has a module supply conduit 64 and a module return conduit 66 that extend across (through) the barrier 20 to connect into the fluid unit 70.

The second liquid cooling module 130 includes a first cooling block 132 in thermal contact with at least one electronic device 120, a second cooling block 134 in thermal contact with at least one electronic device 120, a module supply conduit 131 permanently fixed to the first cooling block 132, a module return conduit 133 permanently fixed to the first cooling block 132, a second module supply conduit (or conduit branch) 135 permanently fixed to the second cooling block 134, and a second module return conduit (or conduit branch) 137 permanently fixed to the second cooling block 134. As shown, the second liquid cooling module 134 forms a second liquid passageway from the second module supply conduit 135 through the second cooling block 134 to the second module return conduit 137. The barrier 20 extends upward to support the conduits 64, 66 of the liquid cooling module 60, as well as the conduits 131, 133 of the second liquid cooling module 130. Furthermore, the barrier 20 still serves to divide the electronics chassis 10 into an electronics region 30 and a liquid isolation region 40. Note that the support member 79 also extends upward to support the conduits of the liquid unit 70 that are aligned with and connected to the liquid cooling modules 60, 130.

Figure 6B:
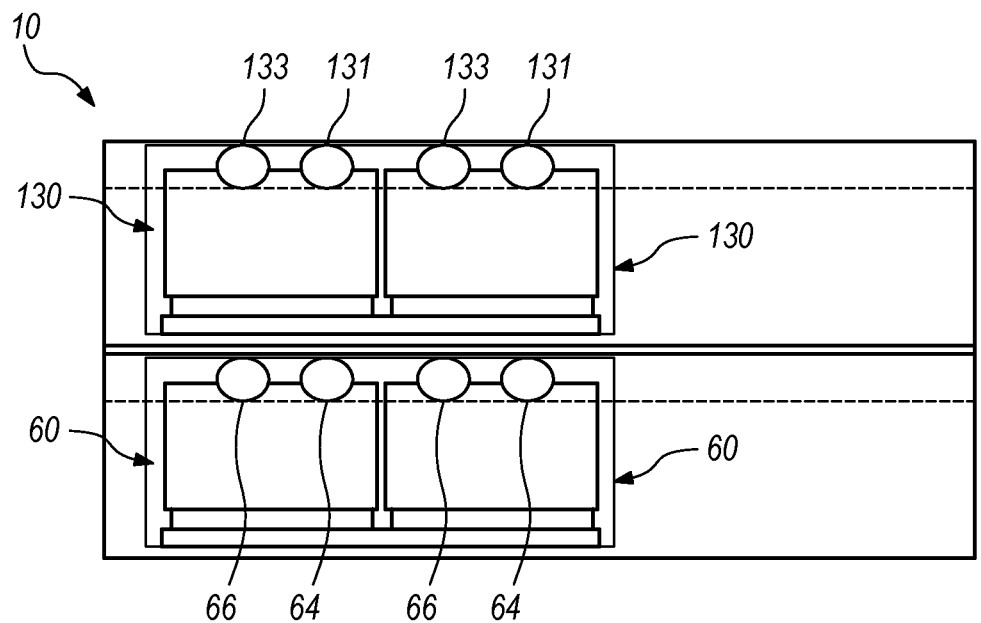
FIG. 6B is a cross-sectional view of the electronics chassis in FIG. 6A taken along lines A-A.

FIG. 6B is a cross-sectional view of the electronics chassis 10 in FIG. 6A taken along lines A-A, except that the conduits 131, 133 and the conduits 64, 66 are position side by side, rather than one above the other. Furthermore, FIG. 6B reveals a second unit of the liquid cooling module 130 at the upper elevation and a second unit of the liquid cooling module 60 in the lower elevation.

Figure 7A:
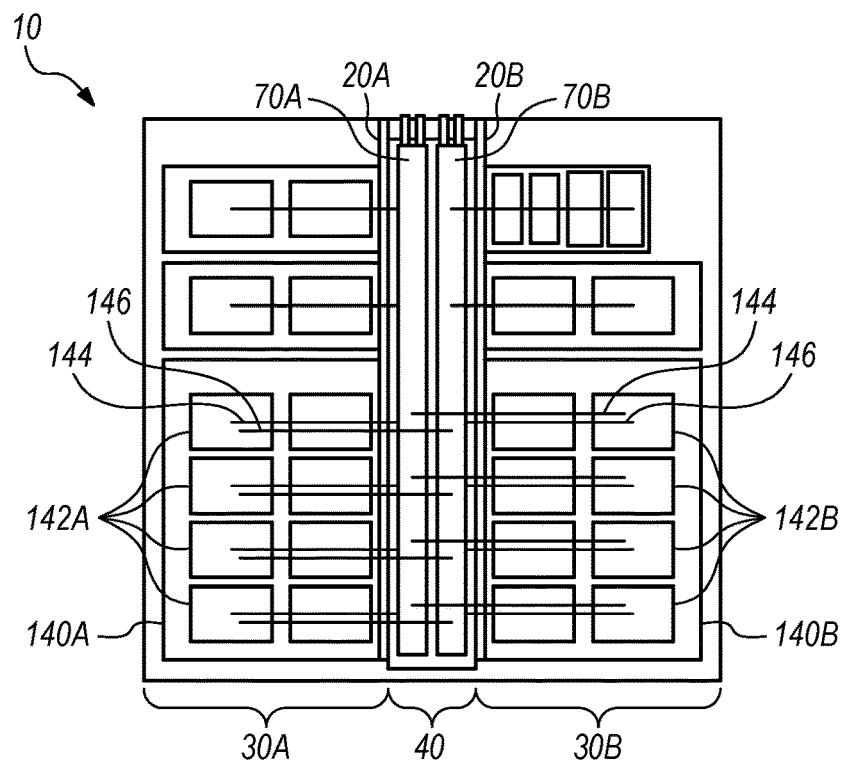
FIG. 7A is a schematic top view of an electronics chassis according to another embodiment having two fluid units in a central liquid isolation zone between two electronics regions.

FIG. 7A is a schematic top view of an electronics chassis 10 according to another embodiment having two fluid units 70A, 70B in a central liquid isolation region 40 between two electronics regions 30A, 30B. Each of the fluid units 70A, 70B may be connected to their own external liquid conduits as shown in FIG. 5. A first barrier 20A and a second barrier 20B define the three regions. Each of the electronics regions 30A, 30B may have a plurality of electronic devices on a plurality of modules. The back two modules in each of the electronics regions 30A. 30B having a liquid cooling module with two to four cooling blocks each. The single line from the fluid unit to the cooling blocks is being used to signify one complete liquid cooling loop (i.e., both a module liquid supply conduit and a module liquid return conduit). For example, look to the connections and conduits between the upper liquid cooling module 130 in FIG. 6A as being representative of the single line in this illustration.

However, the front two modules 140A, 140B having a plurality of liquid cooling modules 142A, 142B that are shown having two lines, wherein each of the liquid cooling modules 142A, 142B has a first line to the first liquid unit 70A and a second line to the second liquid unit 70B. Each line represents an entire liquid loop or path, therefore including both supply and return conduits, perhaps as shown by the upper liquid cooling module 130 in FIG. 6A. However, by having one line (set of liquid conduits forming a liquid loop) 144 connected to the first liquid unit 70A and having another line (set of liquid conduits forming a liquid loop) 146 connected to the second liquid unit 70B, each of the liquid cooling modules 142A. 142B has fully redundant liquid cooling sources. Note that two liquid units 70A. 70B may be provided without having the second barrier 70B and the second electronics region 30B, such that the liquid cooling modules in the first electronics region 30A could still have fully redundant liquid cooling sources.

Figure 7B:
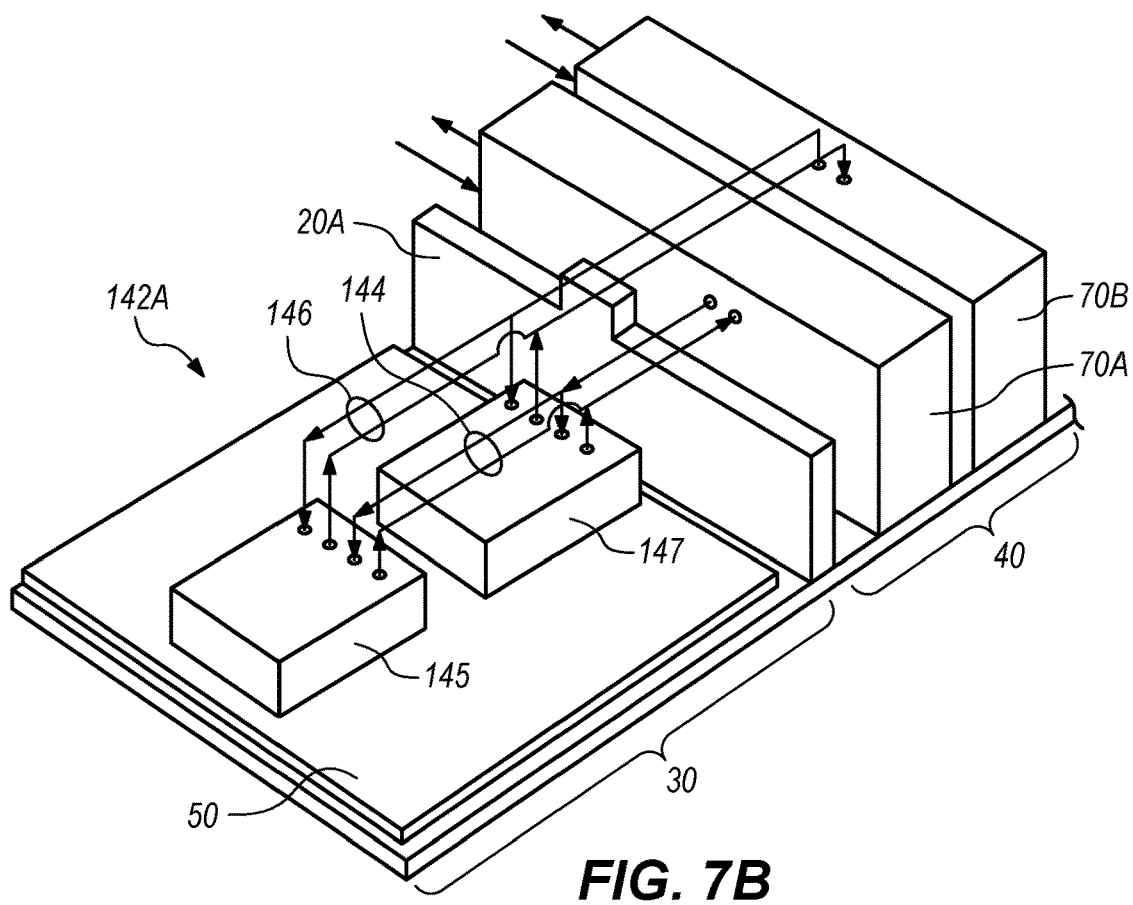
FIG. 7B is a perspective view of two liquid cooling modules having redundant supply and return conduits for cooling critical high performance electronic components.

FIG. 7B is a perspective view of one of the liquid cooling modules 142A having redundant supply and return conduits for cooling critical high performance electronic components (not shown). The first and second liquid units 70A. 70B have their own liquid supply conduit and their own liquid return conduit. The first liquid cooling loop 144 receives liquid from a liquid supply conduit of the first liquid unit 70A, supplies the liquid to both cooling blocks 145, 147, then returns the liquid through the liquid return conduit of the first liquid unit 70A. The second liquid cooling loop 146 receives liquid from a liquid supply conduit of the second liquid unit 70B, supplies the liquid to both cooling blocks 145, 147, then returns the liquid through the liquid return conduit of the second liquid unit 70B. This provides the liquid cooling module 142A with fully redundant liquid cooling sources while still incorporating the features of various embodiments disclosed herein. While no connectors are shown in FIG. 7B, any connectors would be located in the liquid isolation region 40.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:

1. An apparatus, comprising:
an electronics chassis having a plurality of panels forming an enclosure;
a plurality of electronic devices disposed within the electronics chassis;
a liquid cooling module including a cooling block in thermal contact with at least one of the electronic devices, a module supply conduit permanently fixed to the cooling block, and a module return conduit permanently fixed to the cooling block, wherein the liquid cooling module forms a liquid passageway from the module supply conduit through the cooling block to the module return conduit;
a liquid unit including a liquid supply conduit and a liquid return conduit, wherein the liquid supply conduit includes an upstream supply connector for connecting to an external liquid supply conduit and a downstream supply connector connected to the module supply conduit, and wherein the liquid return conduit has an upstream return connector connected to the module return conduit and a downstream return connector for connecting to an external liquid return conduit;
a liquid-tight barrier disposed in the electronics chassis and dividing the electronics chassis into an electronics region and a liquid isolation region, wherein the plurality of electronic devices and the liquid cooling module are located in the electronics region, wherein the liquid unit is located in the liquid isolation region, and wherein the module supply conduit extends across the liquid-tight barrier from the electronics region to the liquid isolation region where the module supply conduit is connected to the downstream supply connector, and wherein the module return conduit extends across the liquid-tight barrier from the electronics region to the liquid isolation region where the module return conduit is connected to the upstream return connector.

2. The apparatus of claim 1, wherein there are no liquid supply or return connectors located in the electronics region.

3. The apparatus of claim 1, further comprising:
the external liquid supply conduit, wherein the external liquid supply conduit is a manifold having connectors disposed at a plurality of locations within a rack; and
the external liquid return conduit, wherein the external liquid return conduit is a manifold having connectors disposed at the plurality of locations within the rack.

4. The apparatus of claim 3, wherein the upstream supply connector is positioned for blind-mating with the external supply conduit when the electronics chassis is inserted into the rack, and wherein the downstream return connector is positioned for blind-mating with the external return conduit when the electronics chassis is inserted into the rack.

5. The apparatus of claim 1, wherein the connectors are quick-connect couplings and/or threaded couplings.

6. The apparatus of claim 1, wherein the module supply conduit and the module return conduit are permanently fixed to the cooling block by a weld or bond.

7. The apparatus of claim 6, wherein the cooling block, the module supply conduit, and the module return conduit are each made of a metal.

8. The apparatus of claim 7, wherein the module supply conduit and the module return conduit are hard metal conduits.

9. The apparatus of claim 7, wherein the module supply conduit and the module return conduit are flexible metal conduits.

10. The apparatus of claim 1, wherein the liquid supply conduit includes flexible conduit to facilitate manual alignment and connection of the downstream liquid supply connector to the module supply connector within the liquid isolation region, and wherein the liquid return conduit includes flexible conduit to facilitate manual alignment and connection of the upstream liquid return connector to the module return connector within the liquid isolation region.

11. The apparatus of claim 1, wherein the plurality of electronic devices includes a compute node having a central processing unit, and wherein the liquid cooling module is in thermal contact with the central processing unit.

12. The apparatus of claim 1, wherein the liquid-tight barrier supports the module supply conduit and the module return conduit.

13. The apparatus of claim 1, wherein the module supply conduit has a distal end with a module supply conduit connector for manually connecting with the downstream supply connector, and wherein the module return conduit has a distal end with a module return conduit connector for manually connecting with the upstream return connector.

14. The apparatus of claim 1, further comprising:
a liquid detection device located in the bottom of the liquid isolation region.

15. The apparatus of claim 1, further comprising;
a support member within the liquid isolation region for supporting the upstream supply connector and the downstream supply connector.

16. The apparatus of claim 1, further comprising:
a second liquid cooling module including a second cooling block in thermal contact with at least a second one of the electronic devices, a second module supply conduit permanently fixed to the second cooling block, and a second module return conduit permanently fixed to the second cooling block, wherein the second liquid cooling module forms a second liquid passageway from the second module supply conduit through the second cooling block to the second module return conduit, wherein the liquid supply conduit has a second downstream supply connector connected to the second module supply conduit, and wherein the liquid return conduit has a second upstream return connector connected to the second module return conduit.

17. The apparatus of claim 1, further comprising:
a second liquid cooling module including a second cooling block in thermal contact with at least a second one of the electronic devices, a second module supply conduit permanently fixed to the second cooling block, and a second module return conduit permanently fixed to the second cooling block, wherein the second liquid cooling module forms a second liquid passageway from the second module supply conduit through the second cooling block to the second module return conduit, wherein the second module supply conduit is permanently branched off of the module supply conduit and the second module return conduit is permanently branched off of the module return conduit.

18. The apparatus of claim 1, further comprising:
a second plurality of electronic devices disposed within the electronics region of the electronics chassis, wherein the second plurality of electronic devices are secured to a printed circuit board directly above the first plurality of electronic devices; and
a second liquid cooling module including a second cooling block in thermal contact with at least one of the electronic devices in the second plurality of electronic devices, a second module supply conduit permanently fixed to the second cooling block, and a second module return conduit permanently fixed to the second cooling block, wherein the second liquid cooling module forms a second liquid passageway from the second module supply conduit through the second cooling block to the second module return conduit, wherein the liquid supply conduit has a second downstream supply connector connected to the second module supply conduit, and wherein the liquid return conduit has a second upstream return connector connected to the second module return conduit, and wherein the barrier extends upward to support the module supply conduit and the module return conduit of the liquid cooling module and the second module supply conduit and the second module return conduit of the second liquid cooling module.

19. The apparatus of claim 1, further comprising:
a second liquid unit including a second liquid supply conduit and a second liquid return conduit, wherein the second liquid supply conduit includes a second upstream supply connector for connecting to a second external liquid supply conduit and a second downstream supply connector connected to a second module supply conduit, and wherein the second liquid return conduit has a second upstream return connector connected to a second module return conduit and a second downstream return connector for connecting to a second external liquid return conduit;
a second liquid-tight barrier disposed in the electronics chassis and further dividing the electronics chassis to create a second electronics region and leaving the liquid isolation region between the two electronics regions; and
a second plurality of electronic devices and a second liquid cooling module are located in the second electronics region, the second liquid cooling module including a second cooling block in thermal contact with at least one of the electronic devices in the second electronics region, the second module supply conduit permanently fixed to the second cooling block, and the second module return conduit permanently fixed to the second cooling block, wherein the second liquid cooling module forms a second liquid passageway from the second module supply conduit through the second cooling block to the second module return conduit, wherein the second liquid unit is located in the liquid isolation region, wherein the second module supply conduit extends across the second liquid-tight barrier from the second electronics region to the liquid isolation region where the second module supply conduit is connected to the second downstream supply connector, and wherein the second module return conduit extends across the second liquid-tight barrier from the second electronics region to the liquid isolation region where the second module return conduit is connected to the second upstream return connector.

20. The apparatus of claim 1, further comprising:
a second liquid unit including a second liquid supply conduit and a second liquid return conduit, wherein the second liquid unit is located in the liquid isolation region, wherein the second liquid supply conduit includes a second upstream supply connector for connecting to a second external liquid supply conduit and a second downstream supply connector connected to the second module supply conduit, and wherein the second liquid return conduit has a second upstream return connector connected to the second module return conduit and a second downstream return connector for connecting to a second external liquid return conduit;

wherein the liquid cooling module includes a second module supply conduit permanently fixed to the cooling block and a second module return conduit permanently fixed to the cooling block, wherein the liquid cooling module forms a second liquid passageway from the second module supply conduit through the cooling block to the second module return conduit; and wherein the second module supply conduit extends across the liquid-tight barrier from the electronics region to the liquid isolation region where the second module supply conduit is connected to the second downstream supply connector, and wherein the second module return conduit extends across the liquid-tight barrier from the electronics region to the liquid isolation region where the second module return conduit is connected to the second upstream return connector.

\* \* \* \* \*